United States Patent [19]

Temple et al.

[11] Patent Number: 5,209,390
[45] Date of Patent: May 11, 1993

[54] HERMETIC PACKAGE AND PACKAGED SEMICONDUCTOR CHIP HAVING CLOSELY SPACED LEADS EXTENDING THROUGH THE PACKAGE LID

[75] Inventors: Victor A. K. Temple; Donald L. Watrous, both of Clifton Park; Constantine A. Neugebauer; James F. Burgess, both of Schenectady; Homer H. Glascock, II, Scotia, all of N.Y.

[73] Assignee: General Electric Company, Schenectady, N.Y.

[21] Appl. No.: 935,805

[22] Filed: Aug. 27, 1992

Related U.S. Application Data

[62] Division of Ser. No. 375,636, Jul. 3, 1989, Pat. No. 5,166,773.

[51] Int. Cl.⁵ .......................................... H01L 21/603
[52] U.S. Cl. .................................. 228/180.2; 228/123; 437/218
[58] Field of Search ............. 228/122, 123, 179, 180.2, 228/189, 265; 437/209, 215, 216, 218

[56] References Cited

U.S. PATENT DOCUMENTS

| | | | |
|---|---|---|---|
| 3,614,554 | 10/1971 | Shield | 357/65 |
| 3,688,018 | 8/1972 | Hiscocks | 172/68.5 |
| 3,719,981 | 3/1973 | Steitz | 437/183 |
| 3,871,014 | 3/1975 | King et al. | 357/67 |
| 3,995,310 | 11/1976 | Koenig | 357/70 |
| 4,338,621 | 7/1982 | Braun | 357/74 |
| 4,544,989 | 10/1985 | Nakabu et al. | 357/81 |
| 4,692,839 | 9/1987 | Lee et al. | 357/81 |
| 4,745,455 | 5/1988 | Glascock, II et al. | 357/74 |
| 4,750,666 | 6/1988 | Neugebauer et al. | 228/160 |
| 4,751,482 | 6/1988 | Fukuta et al. | 357/74 |
| 4,783,695 | 11/1988 | Eichelberger et al. | 357/65 |
| 4,811,079 | 3/1989 | Turina et al. | 357/15 |
| 4,830,264 | 5/1989 | Bitaillou et al. | 228/180 |
| 4,898,320 | 2/1990 | Dunaway et al. | 228/24.5 |
| 4,926,241 | 5/1990 | Carey | 357/74 |
| 5,028,987 | 7/1991 | Neugebauer et al. | 357/80 |
| 5,164,336 | 11/1992 | Ohno et al. | 228/180.2 |

FOREIGN PATENT DOCUMENTS

| | | |
|---|---|---|
| 0186818 | 7/1986 | European Pat. Off. . |
| 52-42371 | 1/1977 | Japan . |
| 5846852 | 10/1983 | Japan . |
| 60-210854 | 10/1985 | Japan . |
| 1-196842 | 8/1989 | Japan . |

OTHER PUBLICATIONS

Aimi, "Solder Reflow Pin Head to Chip Carrier Connection", IBM TDB, vol. 16, No. 8, Jan. 1974, p. 2597.

*Primary Examiner*—Samuel M. Heinrich
*Attorney, Agent, or Firm*—Marvin Snyder

[57] ABSTRACT

A hermetic semiconductor package having a ceramic lid with the device leads extending vertically through the lid is disclosed. The leads are mechanically retained within the apertures in the lid and direct bonded to the lid to provide a hermetic seal and a substantial lead density.

5 Claims, 8 Drawing Sheets

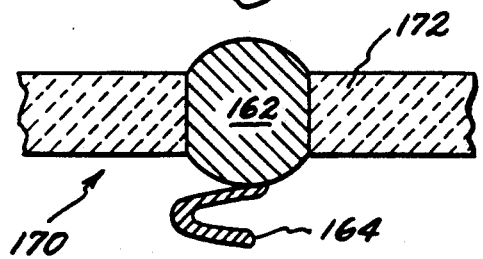
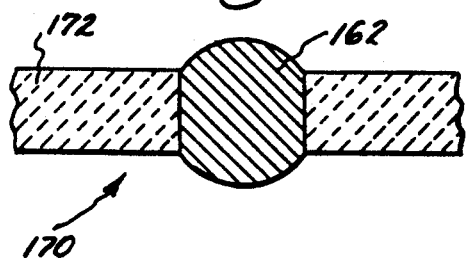
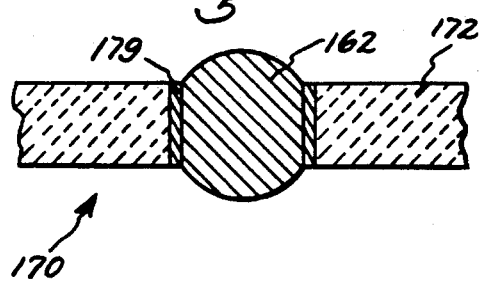
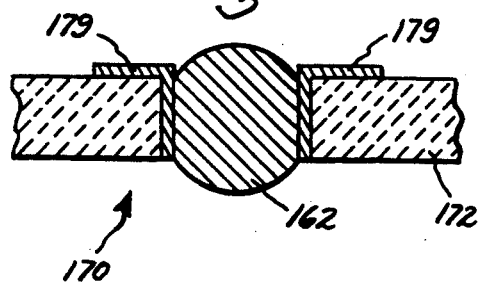
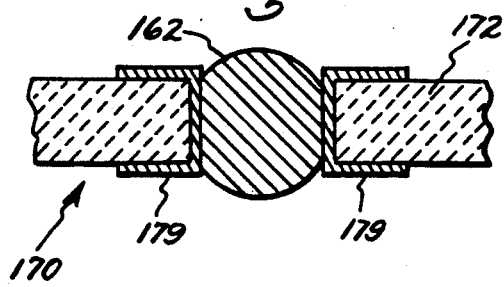
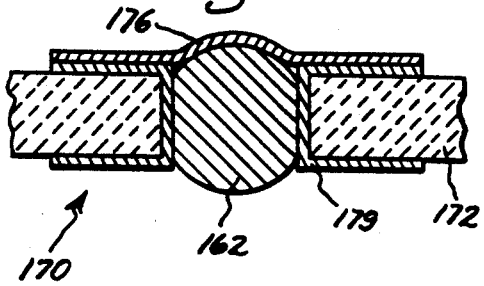
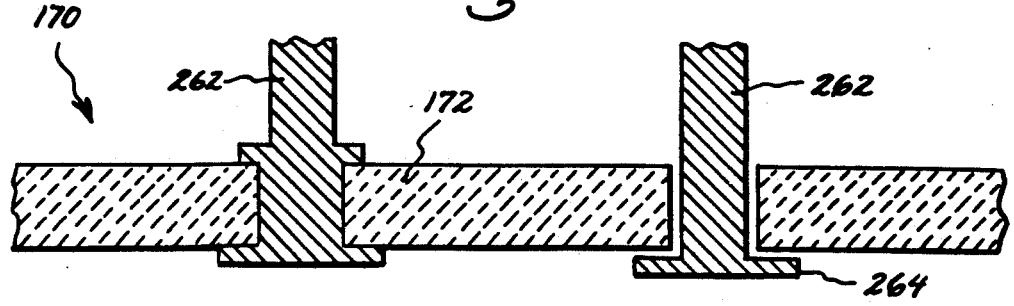

HERMETIC PACKAGE AND PACKAGED SEMICONDUCTOR CHIP HAVING CLOSELY SPACED LEADS EXTENDING THROUGH THE PACKAGE LID

This application is a division of application Ser. No. 07/375,636, filed Jul. 3, 1989, now U.S. Pat. No. 5,166,773.

RELATED APPLICATIONS

The present application is related to application Ser. No. 07/36525 filed Jun 16, 1989, entitled "Hermetic Package Having a Lead Extending Through an Aperture in the Package Lid" by V. A. K. Temple et al.

That patent application is incorporated herein by reference.

FIELD OF THE INVENTION

The present invention relates to the field of packages for semiconductor devices and packaged devices and more particularly to the field of multi-leaded hermetic packages and hermetically packaged devices.

BACKGROUND INFORMATION

Semiconductor devices have been packaged in a vast variety of package configurations. These include both hermetic (gas-tight) and non-hermetic (gas-permeable) packages. Prior art hermetic packages present a number of problems as the operating frequency for the device increases. Such packages, especially for power devices, normally involve a metallic can or case through the sides of which leads extend, with the leads being sealed by glass seals to the can. The chip is bonded to the base of the can and connected to the package leads by wire bonds. As part of the packaging process a lid is sealed over the top of the can to provide a hermetic seal. Such packages suffer from substantial inductance both from the wire bond leads and from the package leads which extend through the can. In order to provide a low thermal coefficient of expansion which closely matches that of the semiconductor chips, these metallic cans are normally made of Kovar ® or Invar ® or similar materials which are magnetic materials. The magnetic material of the can enhances the inductance of these leads.

The above identified related application presents one solution to these prior art problems in a form of a package in which the leads extend vertically through the lid of the package and in which the package may be fabricated without the use of magnetic materials. Unfortunately, the preferred embodiment of that package restricts the density with which leads may be brought through the lid of the package while maintaining a hermetic seal.

One application where a high density of leads extending through the lid of the package would be particularly desirable is in high density interconnect systems of the type disclosed in U.S. Pat. No. 4,783,695, entitled, "Multichip Integrated Circuit Packaging Configuration and Method" by C. W. Eichelberger et al., since logic and other relatively high I/0 lead count devices could be packaged in a compact, hermetically sealed package prior to mounting and interconnection using a high density interconnect system of the type described in the above-identified application.

It would be desirable to have a package of the type disclosed in application Ser. No. 07/367525 in which individual leads may be more closely spaced while still being electrically isolated from each other.

OBJECTS OF THE INVENTION

Accordingly, a primary object of the present invention is to provide a hermetically sealed package having a relatively high density of leads extending through the lid of the package.

SUMMARY OF THE INVENTION

The above and other objects which will become apparent from this specification as a whole, including the drawings, are accomplished in accordance with a preferred embodiment of the present invention by a semiconductor device package in which individual leads which extend through the lid of the package are disposed in intimate contact with the wall of the aperture through which they extend to effect a hermetic seal In an alternative embodiment, an annulus of metal on the upper and lower surfaces of the lid adjacent the aperture and the wall of the aperture are metallized prior to disposal of the lead in the aperture in order to provide a greater path length for the interface which provides the hermetic seal.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIGS. 7-13 illustrate details of alternative configurations of the package lid and leads extending therethrough.

DETAILED DESCRIPTION OF THE INVENTION

Figure 1:
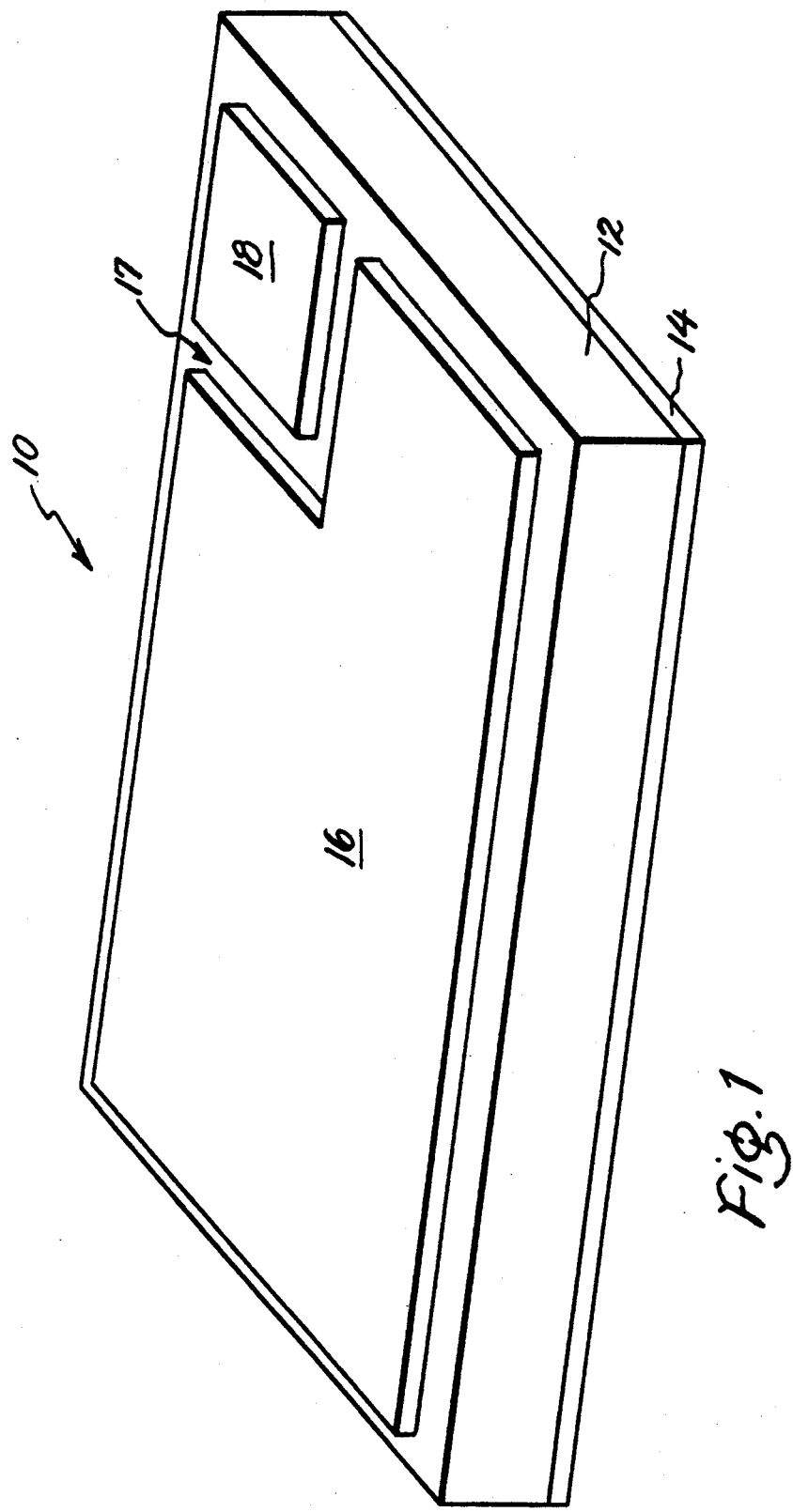
FIG. 1 is a perspective view of a chip suitable for packaging in accordance with the related application.

In FIG. 1, a power semiconductor device is illustrated generally at 10. This device comprises a semiconductor chip 12 having a solderable metallization 14 on its lower surface and two contact pads 16 and 18 disposed on its upper surface and spaced apart by a gap 17. Devices which may be fabricated in this configuration include field effect power transistors, MOS controlled thyristors (MCTs) and so forth. In this device, the metallization 14 and contact pad 16 are the power contacts for the device and the contact pad 18 is the gate or control contact for the device.

Figure 2:
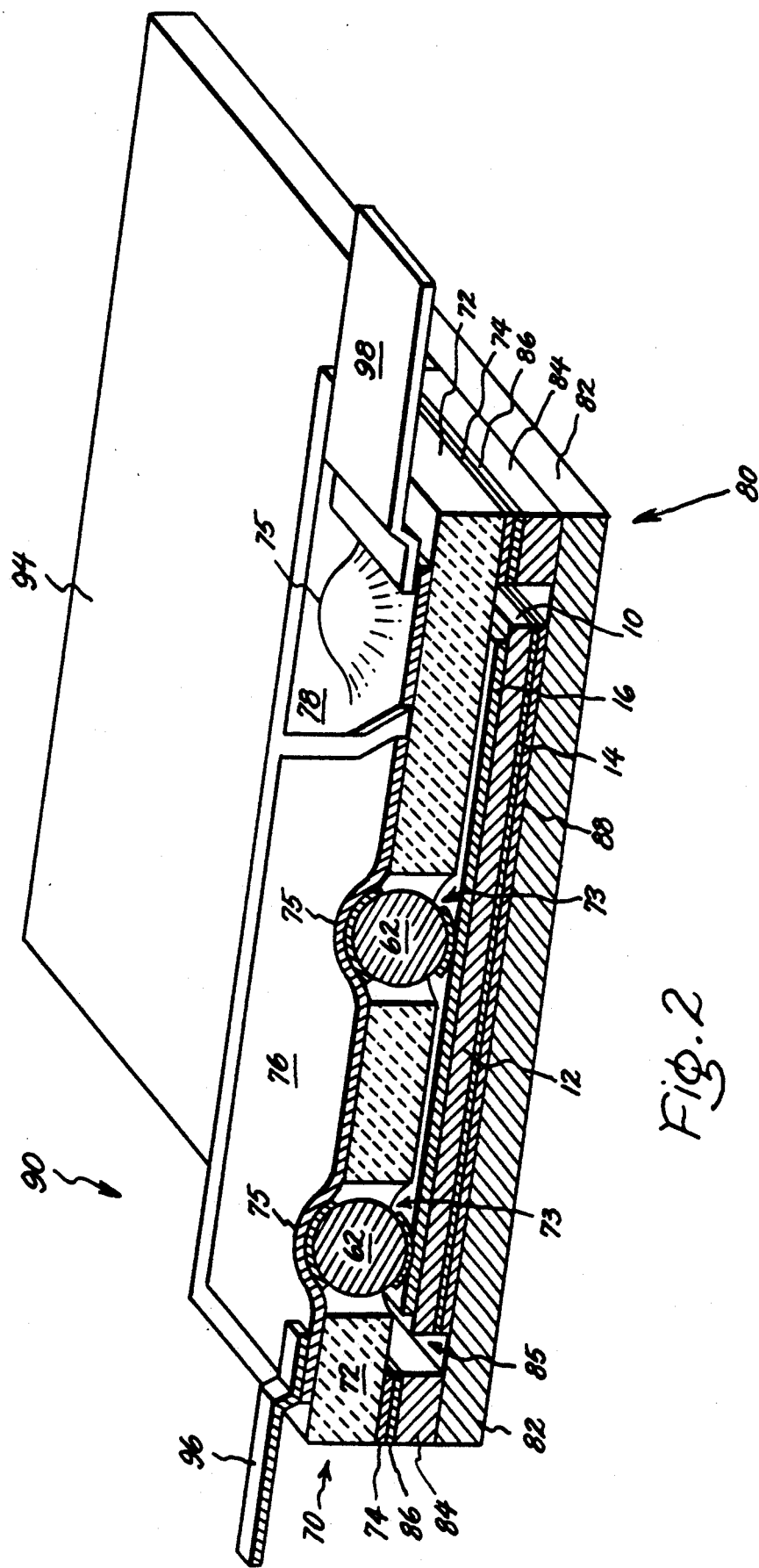
FIG. 2 is a cross-section through a completed package in accordance with the related application.

In FIG. 2, the device of FIG. 1 is shown in cross-section in a package 90 in accordance with the above identified related application. The package 90 comprises a lid 70 and a base 80 which together provide a cavity 85 in which the semiconductor device 10 is disposed. The package base 80 comprises a metallic plate 82 having a frame 84 direct bonded thereto or integral therewith which provides the cavity 85 in which the semiconductor device 10 is disposed. On the upper surface of the frame 84 a layer of solder 86 is disposed. The package lid 70 comprises a ceramic plate 72 having apertures 73 therein and a frame 74 around the periphery of the inner surface of that plate. The lid further includes two foil terminals 76 and 78 disposed on the outer surface of the plate 72 and extending across the apertures 73 in the plate 72. The foil terminals 76 and 78 are direct bonded to the outer surface of the plate 72 to provide a hermetic seal around the apertures 73. The terminals 76 and 78 are preferably copper foil on the order of 1–25 mils (0.025–0.63 mm) thick which has been direct bonded to the ceramic substrate 72 by the direct bond copper process described in U.S. Pat. No. 3,744,120 to Burgess et al., U.S. Pat. No. 3,766,634 to Babcock et al., U.S. Pat. Nos. 3,854,892 and 3,911,553 to Burgess et al., U.S. Pat. Nos. 3,994,430 and 4,129,243 to Cusano et al., U.S. Pat. Nos. 4,409,278 to E. P. Jochym and U.S. Pat. No. 4,563,383 to Kuneman et al. Each of these patents is incorporated herein by reference. Alternatively, the copper foil could be brazed to the ceramic using the molybdenum manganese process, for instance. The only limitation on the process used to bond the foil to the ceramic being that a hermetic seal must be produced for a hermetic package. It is preferred for reasons discussed hereinafter that the foil terminals 76 and 78 be flexible where they extend across the apertures in the lid.

In order for the package 90 to be hermetically sealed, the conductive foils 76 and 78 must provide a hermetic seal enclosing the apertures 73 within the package. In this package, it is preferred to have each of the apertures positioned 100 mils or more from the nearest edge of the foil terminal which covers it because in direct bonding copper to alumina plates, a direct bond distance of 100 mils essentially ensures the provision of a hermetic seal every time. As the length of the shortest path from the aperture to the edge of the foil terminal decreases, the yield percentage of hermetically sealed lids decreases. A copper ball 62 which is preferably a sphere is disposed in each of the apertures 73 and bonded to the contact pad (16) of the chip disposed thereunder and also to the foil terminal 76 which spans that aperture. The chip 10 is bonded to the base plate 82 by a layer of solder 88 via the back metallization 14 on the chip. External terminal extensions and 98 are bonded, as by solder, to the foil terminals 76 and 78 while an extension of the base plate 82 serves as the third electrode 94 of the device package. As described in the related application, this package may also be fabricated using solderless bonding instead of solder bonding. As used in this specification and the appended claims, "solderless bond or solderless bonded" means without solder, i.e. a direct bond. Thus, solderless bonded includes thermocompression bonded, ultrasonically bonded, thermosonically bonded, diffusion bonded, cold welded, resistance welded, laser welded, spot welded, direct bonded copper and any other similar bonding process. The term "direct bonded" is used to refer to processes like the direct bond copper process described in the patents listed above. This package provides a number of benefits for devices of the type shown in FIG. 1 which have a single large contact pad with a separate control contact pad. In particular, a number of separate conductive pellets 62 are bonded to the large contact pad to limit the amount of current which must flow laterally through the contact pad 16 to reach the various active portions of the device. Only a single contact is needed to the pad 18 because of its small size and low current draw. As explained above, a margin of 100 mils (2.54 mm) is desired between the edge of a foil terminal such as terminal 76 and the nearest aperture 73 under that foil terminal in order to ensure that a hermetic seal is provided. This limits individual isolated leads to being spaced from each other by at least 250–300 mils, (6.3–7.6 mm) center-to-center because the conductive balls are 40 mils in diameter and isolation gaps of 10–50 mils (0.25–1.25 mm) are needed between the foil terminals for adjacent leads, depending on the voltage difference expected between those terminals.

Figure 3:
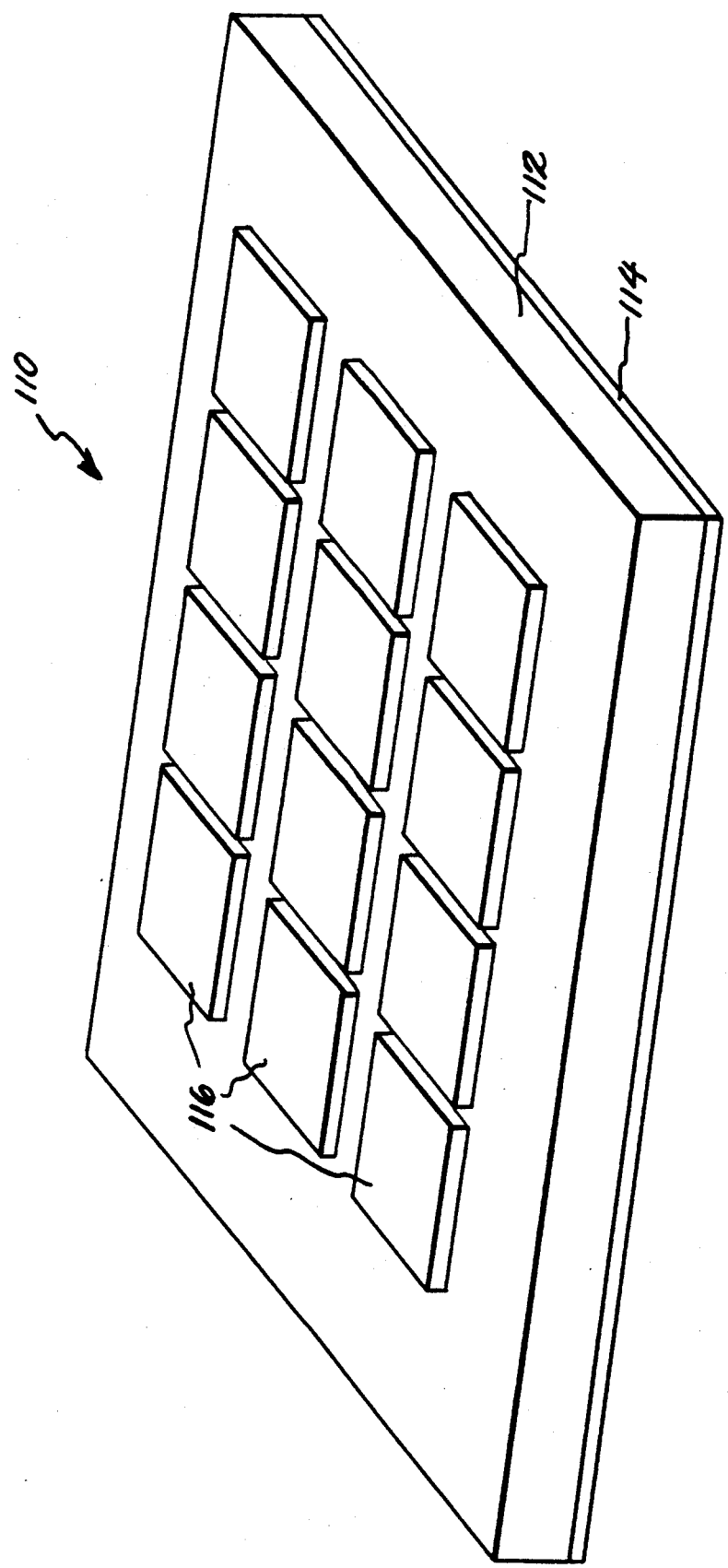
FIG. 3 is a perspective illustration of a semiconductor chip suitable for packaging in accordance with the present invention.

A chip 110 which is suitable for mounting in accordance with the present invention in a package of the general type disclosed in the above identified related application is illustrated in FIG. 3. This chip 110 comprises a semiconductor body 112 having a back metallization 114 and an array of contact pads 116 on its upper surface. The contact pads 116 are disposed on centers which are less than 250 mils (6.3 mm) apart. It is desired to connect a separate lead to each of the contact pads 116. Unfortunately, as has been discussed above, at the present time the package of the related application is preferably restricted to packaging chips in which the individual leads are spaced at least 250 mils apart, center-to-center. Where the center-to-center spacing in the array of contact pads is less than this distance, that package becomes less effective because of a problem with the yield of hermetic packages. Consequently, the chip 110 is not presently suitable for mounting in that package. In FIG. 6, a completed packaged device in accordance with the present invention is shown in a perspective cross-section view. The package 190 in FIG. 6 is similar to the package 90 in FIG. 3 and reference numerals ending in the same two digits identify similar structures. Where those structures are not described in detail here, they serve a similar function and the reader is referred to the discussion of the corresponding reference numeral in the earlier figure or the related application for a discussion of the function of the individual components. The component parts of and the process of fabricating the package 190 of FIG. 6 will now be described in connection with FIGS. 4–6.

Figure 4:
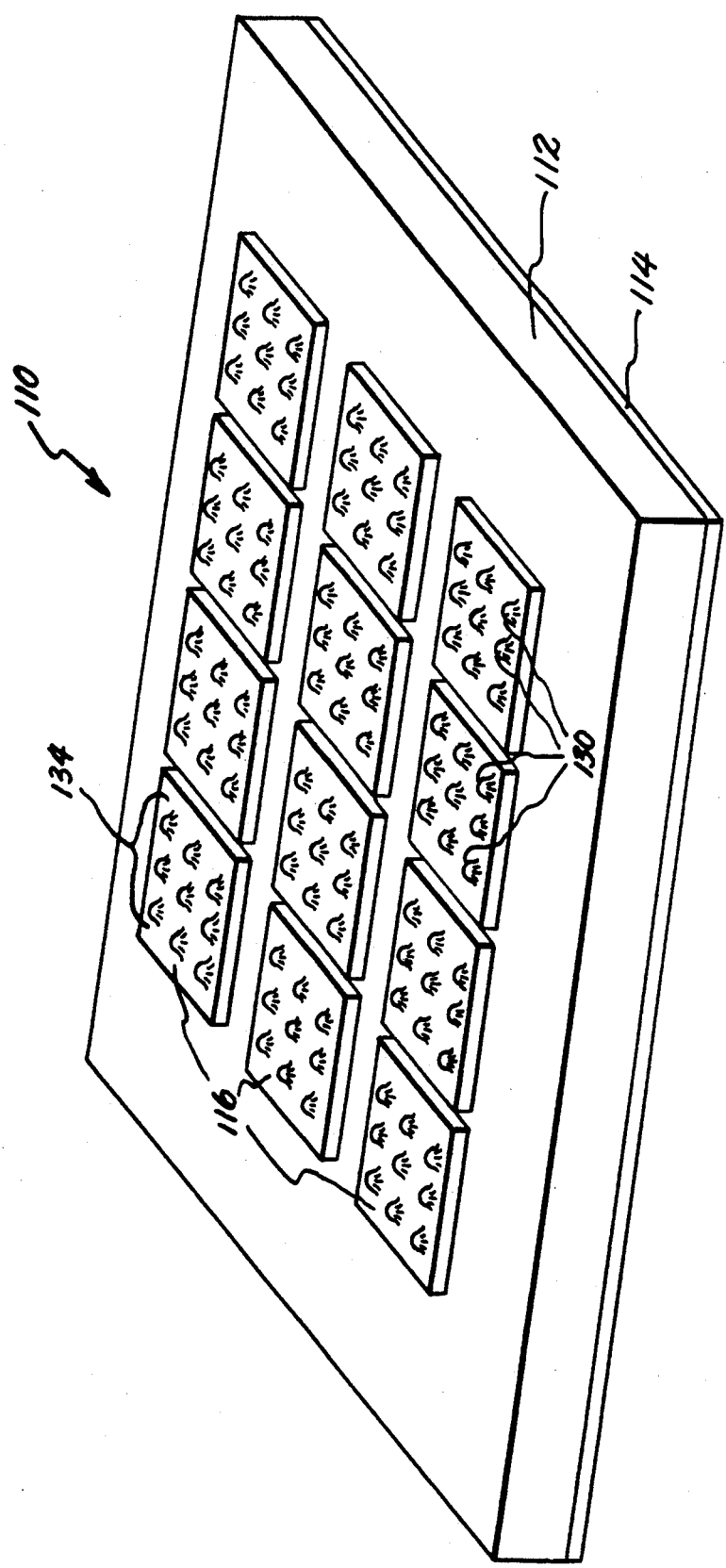
FIG. 4 illustrates the chip of FIG. 3 ready for bonding to the package lid.

The beginning of the packaging process for a device 110 whose contact pads are non-solderable is illustrated in FIG. 4. In FIG. 4, an array 134 of conductive bumps 130 is disposed on each of the contact pads 116. The conductive bumps 130 can be laid out in an orderly manner within the array of bumps or may be randomly positioned, as may be desired. The arrays 134 of gold bumps disposed on the contact pads 16 comprise 3×3 arrays of the gold bumps 130.

In a preferred embodiment, each of the conductive bumps 30 is a gold "disk" having a pancake-like upper surface. Each of these gold bumps may preferably be formed in accordance with the teachings of U.S. Pat. No. 4,750,666 to Neugebauer et al., which is incorporated herein by reference. As explained in more detail therein, a gold wire bonder is used to form these bumps. First, a gold ball is formed on the end of the gold wire and bonded to the contact pad 16 or 18 in the same fashion as it would be bonded thereto if a gold wire bond was being formed. However, once the bump has been bonded to the contact pad, rather than releasing the wire for movement through the bonding head as is done in forming a wire bond (while the bonding head moves to the location where the other end of the wire is to be bonded), the wire is held fixed and the bonding head is moved laterally to shear the wire from the bump. This leaves a bump with a substantially smooth upper surface. Alternatively, the wire may be broken by pulling vertically or melting. A pigtail of the wire may be left on the bump so long as it does not interfere with the subsequent steps in the fabrication process. Conductive bumps other than gold may be employed, if desired. Gold bumps are preferred at this time because of the well-established techniques for gold wire bonding which are easily modified to provide gold bumps in various locations, because of the solderability of gold and because if thermocompression bonding is used to bond to the gold bumps, that thermocompression bonding is easier with gold bumps than with flat metallization. The use of gold bumps is also preferred because there is no yield loss at the wafer level. Alternatively, chromium copper metallization could be used with its attendant yield loss during processing at the wafer level.

The size of the gold bumps 130 is somewhat dependent on the diameter of the gold wire employed in creating the gold bumps. With 1 mil diameter gold wire, a bump about 3 mils in diameter at the pad surface and 1 mil high is produced. The use of larger diameter wire provides a larger diameter, taller bump. The individual gold bumps 130 are preferably produced by an automatic wire bonding machine which has been programmed to position the bumps in the desired locations. A wire bonding machine such as the K&S Model 1419 is effective for this purpose. The model 1419 is externally programmable with the program in use depending on the disk inserted in its disk drive, is rated to produce two wire bonds per second and is capable of forming more gold bumps per second since a wire bond requires the formation of a bond at each end of the wire and thus requires that the bonder contact the chip and its package twice per wire bond, whereas during bump formation, each contact produces a separate bump. Thus, a very effective production process results, especially since the use of gold bumps makes the provision of a solderable metallization on pads 116 and 118 unnecessary. Other bonding machines may also be utilized. After formation of the gold bumps 130, solder is dispensed onto the conductive bumps 130 in preparation for bonding the chip to a package lid.

Figure 5:
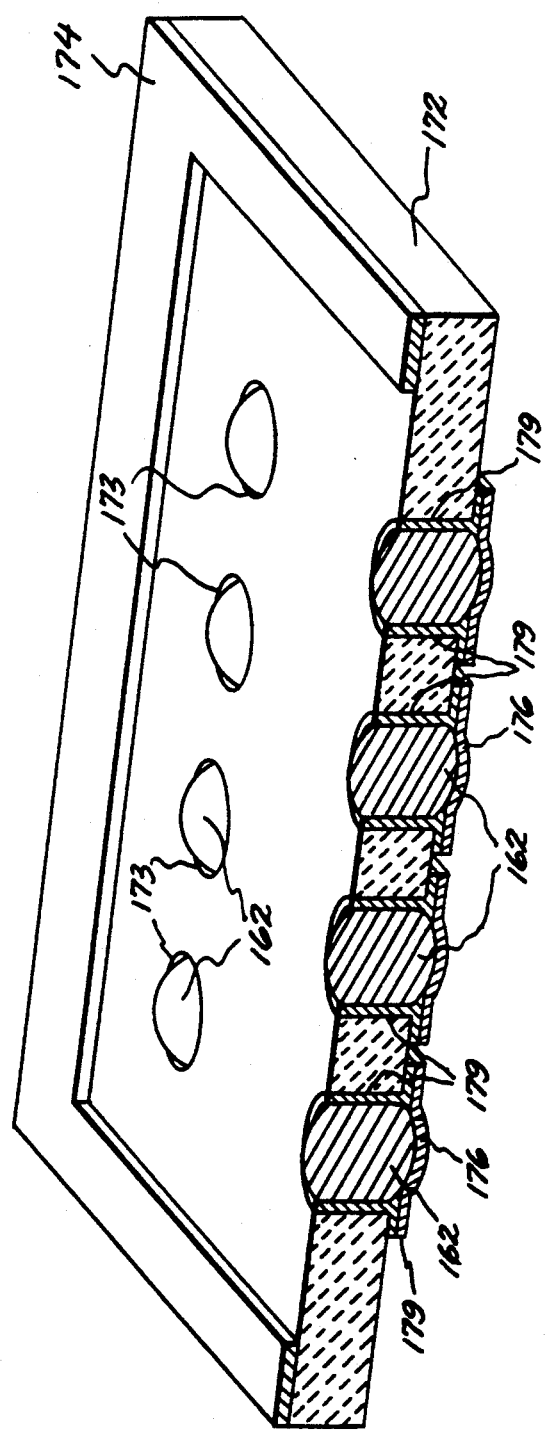
FIG. 5 illustrates a package lid.
Figure 6:
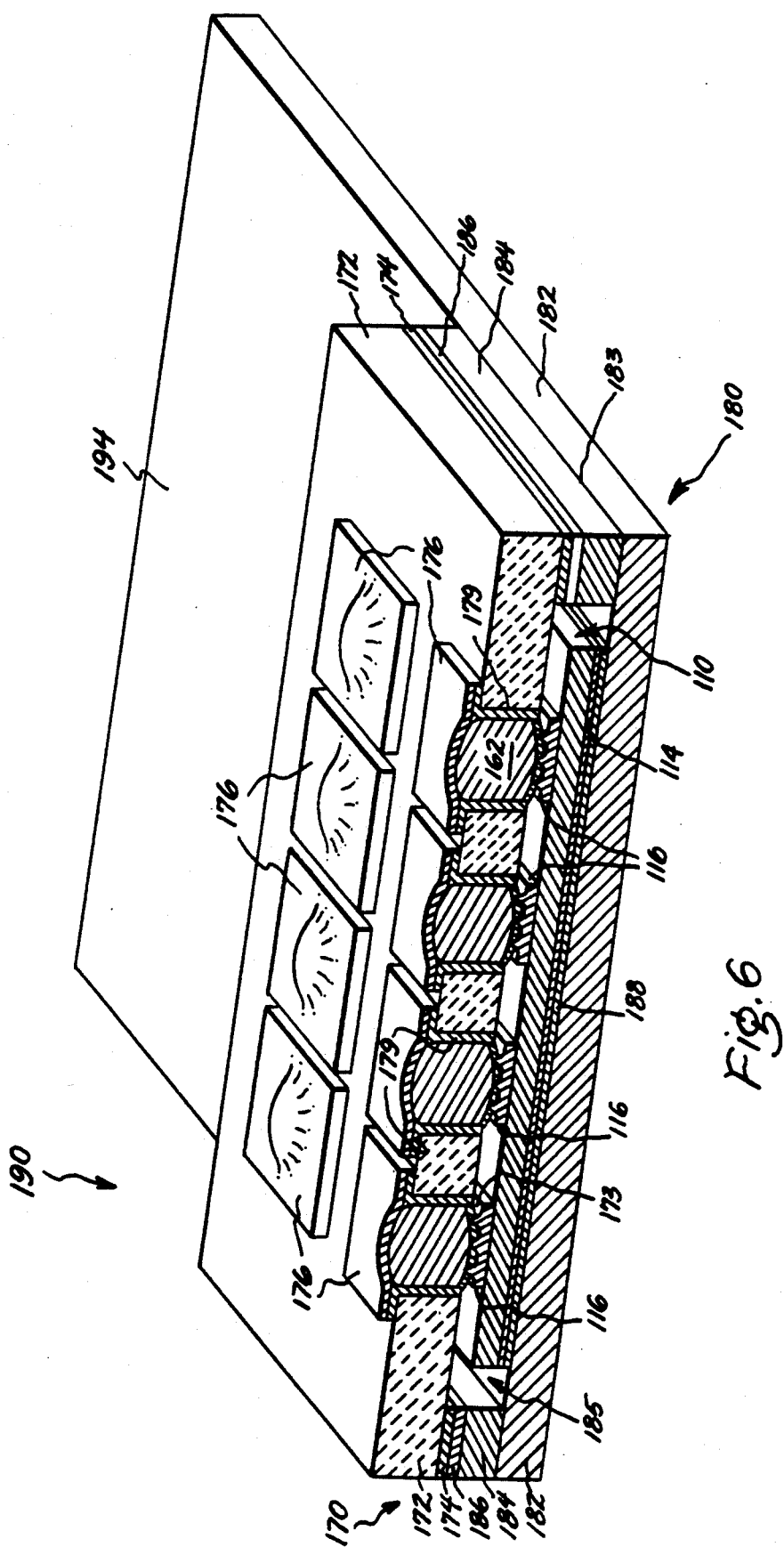
FIG. 6 is a cross-section through a package in accordance with the present invention.

In FIG. 5, a lid 170 for the package is illustrated in a partial cut away perspective view of the inside of the lid. The lid 170 is modified as compared to the lid 70. In particular, more apertures 173 are provided in the lid 170 and the leads or conductive pellets 162 are disposed in intimate contact with the aperture walls to mechanically retain the conductive pellets or leads within the apertures and also to provide a hermetic seal of the aperture. In the embodiment illustrated in FIG. 5, the wall of the aperture and an annulus around that aperture on the outer surface of the lid have been metallized with a copper metal layer 179 prior to the insertion of the conductive pellets into the apertures. Thereafter, the conductive pellets have been compressed vertically in the figure in order to expand them laterally into intimate contact with the metallization 179. The term "pellet" is used in this specification and the appended claims as a general term for a small body, without limitation as to its explicit geometric shape. Thus, the term "pellet" includes a ball, a sphere, a cylinder, parallelepipeds, irregular shapes and regular geometric solids such as dodecahedrons and so forth. It is preferred to use spheres as the conductive pellets for several reasons. First, they provide a smooth surface for bonding to the foil terminals 176 which extend over the pellets and the surface portion of metallization 179. Second, being round, they are easy to roll into the holes in a wafer-size pellet positioning template for positioning pellets in many lids at the same time, and third, they are readily available on the commercial market in a wide variety of diameters. It is not necessary for the conductive pellets to be solid, they may be hollow bodies, if desired. However, it is generally preferred that they be solid spheres, both for ease of their own manufacture, reproducibility of their compression/expansion and to avoid any question of the presence of a contaminating atmosphere within a pellet escaping into the package. The pellets also preferably have a post-compression thickness which is greater than the thickness of the insulating substrate portion of the lid so that they extend beyond the substrate on both sides of the substrate even after compression to expand them laterally. After compression of the pellets, the individual foil terminals 176 (FIG. 6) are disposed on the surface of the annular portion of the metallization 179 and the conductive pellet 162. The entire lid is then subjected to the copper direct bond process to directly bond the copper pellets and the copper metallizations to the ceramic plate to provide a hermetic seal at each of the apertures 173. In particular, for a ceramic plate 25 mils (0.63 mm) thick, 25 mils of path length of the seal are provide by the aperture wall. This reduces the needed width for the annular portion of the metallization 179 to 75 mils which for a 40 mil diameter aperture results in a minimum diameter for the metallization 176 of 190 mils as compared to 245 mils (45 mil diameter aperture) for the package of FIG. 2. This is a 20% saving in area.

By extending the metallization 179 onto the inner surface of the lid 170 as shown in FIG. 11, a 100 mil seal path can be provided by annuluses inside and outside having widths of 37 ½ mils for a total diameter for the metallization 176 of 115 mils or a more than 50% linear (75% area) saving as compared to the package of FIG. 2. As direct bond processes are improved, the minimum size for the metallization 179 for consistently providing a hermetic seal of the aperture should be reduced further.

The more than 2 to 1 reduction for the linear dimensions of the contact metallizations 176 corresponds to more than a 4 to 1 reduction in their area and allows a substantial increase in the density of leads extending through the lid. The package is preferably assembled in two steps. First, the chip 110 in the configuration shown in FIG. 4, but with solder in place on the bumps 130 has the lid 170 inverted relative to its FIG. 5 orientation and placed on the chip 110. Once the individual pellets 162 are aligned with the corresponding individual contact pads 116, the structure is heated to the melting point of the solder to reflow the solder. As the structure cools, the solder solidifies and bonds each of the contact pads 116 to the corresponding conductive pellet 162 in the lid 170.

Thereafter, this combined structure is placed on and aligned with a package base of the type shown in the related application. The package base includes a central solder pad or layer 188 (FIG. 6) for bonding to the chip metallization 114 and a solder layer on frame 184 (FIG.

6) for bonding the frame 174 of the lid to the base frame 184 to hermetically seal the package.

This package may preferably be assembled by gang bonding the individual contact pads 116 to the individual conductive leads 162 and then placing the chip and lid on the base plate 180 and bonding the chip back metallization 114 to the base plate 180 with the solder 188 and the lid frame 174 to the base frame 184 with solder layer 186. This lid structure may also be used with chips like chip 10 in FIG. 1 which do not require closely spaced leads.

In the configuration shown, tight tolerances on chip thickness, solder layer thickness, frame thicknesses and lid flatness must be maintained to ensure contact between each of the conductive pellets 162 and the associated contact pad 116 and between metallization 114 and the base member. These assembly tolerances can be significantly increased by including a strain relief lead within the package cavity 185 on each of the leads extending through the lid. Such a strain relief is illustrated in FIG. 7, where a C-shaped bend in a lead 164 bonded to the conductive pellet 162 will be compressed during package assembly to ensure contact between the pad 116 and the pellet 162. As an alternative to bonding the C-shaped lead to the pellet, the C-shaped lead may be a wire on which the conductive pellet is formed by an appropriate process such as heat forming.

A variety of other configurations for a conductive pellet and its bond to the lid plate 172 are illustrated in FIGS. 8-13. In FIG. 8, the aperture and the surrounding portion of the ceramic plate 172 are free of metallizations and the pellet 162 is compressed into intimate contact with the walls of the aperture and direct bonded to it to provide the desired hermetic seal. At the present time, for thin ceramic plates on the order of 25 mils thick, the yield of hermetic seals for this configuration is less than ideal. However, when improved direct bonding processes are developed, this may become a high yield configuration and is desirable because of the small diameter, 60-90 mils (1.52-2.25 mm), of the lid area which must be dedicated to each lead.

In FIG. 9, the FIG. 8 structure is modified by the addition of metallization 179 on the vertical wall of the aperture. This structure also provides less than ideal yield at the present time. In FIG. 10, metallization 179 is provided on the aperture wall and in an annulus on the upper surface of the ceramic plate surrounding that aperture. This provides an increased yield of hermetic seals because of the increased length of the copper/ceramic interface.

In FIG. 11, the metallization 179 on the aperture walls extends onto both surfaces of the ceramic plate in an annular fashion. This further improves the yield of hermetic seals for the same size of the annulus as in FIG. 10. A metal foil seal 176 may be provided across the top of the conductive pellet 162 in any of these configurations as shown in FIG. 12 for the FIG. 11 configuration. The addition of such a foil can be expected to substantially increase the quantity of hermetic seals for the FIGS. 8 and 9 structures since it increases the seal length and can also be beneficial for the FIGS. 10 and 11 structures depending on the relative size of the electrode. A further alternative configuration for the lead is shown in FIG. 13 where a copper lead 262 having a nail head 264 on one end is shown inserted in the right hand aperture in plate 72 prior to the bonding of that lead to the ceramic plate 72. In the left hand aperture in plate 172, the nail head lead 262 has been bonded to the ceramic by swaging the lead to expand it laterally into intimate contact with the aperture walls after which the structure is direct bonded to bond the lead to the ceramic to provide the desired hermetic seal. This lead structure has the further advantage of providing a compliant external lead which is disposed in the aperture in the lid.

Figure 14:
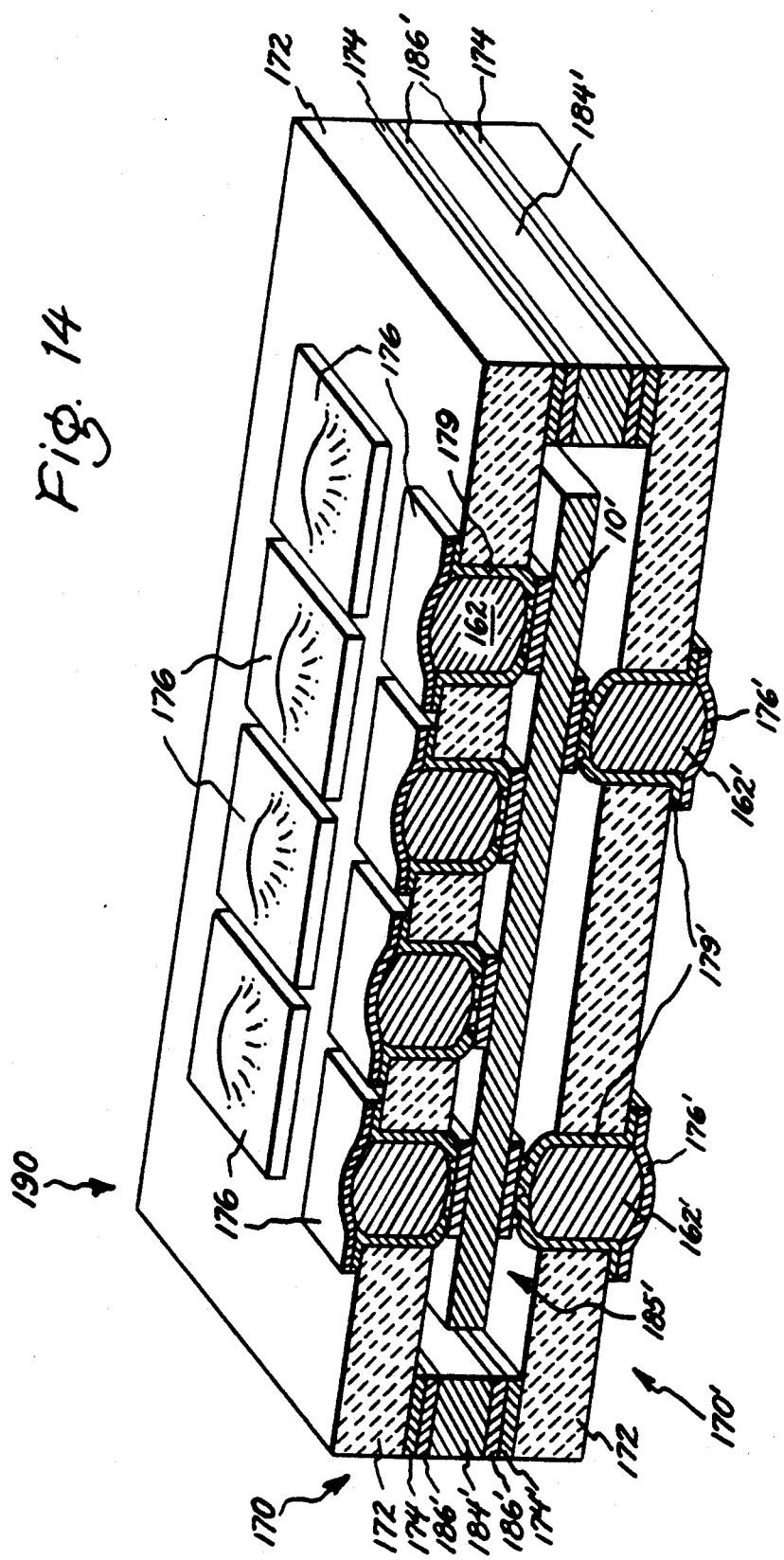
FIG. 14 illustrates an alternative package configuration for a "two-sided" chip.

Naturally, this package can also be used for a chip which has multiple electrodes on each surface. In that situation, the package base 180 is omitted and replaced by a second lid 170' as shown in FIG. 14. The frame 184' which spaces the two lids apart to define the height of the cavity 185' may be a single metal piece (as shown) which is bonded to both lids at the same time as part of the sealing process or which is bonded to one of the lids as part of its fabrication process or it may be two pieces, each of which is bonded to a different one of the lids as part of the lid fabrication process, i.e. thickened frames 174 and 174' in which case only a single solder layer is needed to seal the package.

In FIG. 14, the lid 170' is similar to the lid 170 in having the pellets mechanically retained therein. Alternatively, the second or lower lid can be like lid 70 in having apertures which are larger than the pellets. In such a structure, the "loose" pellets in the lower lid provide assembly compliance in the manner discussed in the related application Ser. No. 07/367525 while the upper lid provides closely spaced isolated leads. Package assembly tolerance can be provided by use of this second "lid" having oversized apertures to contact a single continuous backside metallization 114, since the foil terminal dimples over its apertures will then afford the same tolerance for package component thicknesses which is discussed in detail in related application Ser. No. 07/367525.

While the above discussion has been in terms of assembling these packages using solder bonds, these packages can also be assembled using solderless bonds, preferably thermocompression bonds.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method of fabricating a packaged semiconductor chip comprising the steps of:
   providing a ceramic lid having first and second opposed major surfaces and a plurality of apertures therein;
   placing a conductive pellet in each of said apertures;
   compressing said conductive pellets in a direction substantially perpendicular to said first major surface to expand said pellets in a direction parallel to said first major surface and into intimate contact with the wall of said aperture; and
   bonding contact pads on said chip to said pellets and bonding said lid to a package base to seal said package.

2. The method recited in claim 1 wherein said lid is ceramic and said pellets are copper and said method further comprises the step of:
   direct bonding said copper pellets to said ceramic lid to provide a permanent hermetic seal between each of said pellets and said lid.

3. The method recited in claim 2 further comprising:

providing a patterned copper foil over said lid and said pellets;

direct bonding said copper foil to said lid at the time of direct bonding said pellets to said lid.

4. The method recited in claim 3 further comprising:

direct bonding said foil to said pellets at the same time as the direct bonding of said pellets and said foil to said lid.

5. The method recited in claim 1 further comprising the step of:

metallizing said aperture walls prior to the step of compressing.

* * * * *